(12) United States Patent
Ye (10) Patent No.: US 7,170,436 B2
(45) Date of Patent: Jan. 30, 2007

(54) CURRENT MODE ANALOG-TO-DIGITAL CONVERTER USING PARALLEL, TIME-INTERLEAVED SUCCESSIVE APPROXIMATION SUBCIRCUITS

(75) Inventor: Jun Ye, San Diego, CA (US)

(73) Assignee: Symwave, Inc., San Diego, CA (US)

( * ) Notice: Subject to any disclaimer, the term of this patent is extended or adjusted under 35 U.S.C. 154(b) by 0 days.

(21) Appl. No.: 11/157,322

(22) Filed: Jun. 20, 2005

(65) Prior Publication Data

US 2005/0285770 A1 Dec. 29, 2005

Related U.S. Application Data

(60) Provisional application No. 60/582,588, filed on Jun. 24, 2004.

(51) Int. Cl.
*H03M 1/12* (2006.01)

(52) U.S. Cl. .................. 341/155; 341/122; 341/141

(58) Field of Classification Search .............. 341/155, 341/156, 158, 159, 200, 120, 122, 161; 327/103; 330/9

See application file for complete search history.

(56) References Cited

U.S. PATENT DOCUMENTS

| | | | | |
|---|---|---|---|---|
| 4,633,226 A | * | 12/1986 | Black, Jr. .................. 341/159 |
| 5,099,239 A | * | 3/1992 | Bruce et al. ................. 341/155 |
| 5,283,582 A | * | 2/1994 | Krenik ........................ 341/158 |
| 5,489,904 A | * | 2/1996 | Hadidi ........................ 341/156 |
| 5,675,341 A | * | 10/1997 | Vallancourt et al. ........ 341/158 |
| 5,815,012 A | * | 9/1998 | Rivoir et al. ................. 327/103 |
| 5,886,659 A | * | 3/1999 | Pain et al. .................... 341/155 |
| 6,011,502 A | * | 1/2000 | Kao ............................. 341/156 |
| 6,094,154 A | * | 7/2000 | Lee ............................. 341/161 |
| 6,326,914 B1 | * | 12/2001 | Sevenhans .................. 341/156 |
| 6,445,319 B1 | * | 9/2002 | Bugeja ........................ 341/138 |
| 6,496,126 B2 | * | 12/2002 | Zhan et al. .................. 341/139 |
| 6,597,299 B1 | * | 7/2003 | Bugeja ........................ 341/122 |
| 6,724,329 B2 | * | 4/2004 | Casper ........................ 341/106 |
| 6,731,231 B2 | * | 5/2004 | Roovers et al. ............. 341/156 |
| 6,831,507 B2 | * | 12/2004 | Granville ........................ 330/9 |
| 6,909,394 B2 | * | 6/2005 | Doerrer et al. ............. 341/200 |
| 6,937,174 B2 | * | 8/2005 | Higashi et al. ............. 341/122 |

\* cited by examiner

*Primary Examiner*—Linh Nguyen
(74) *Attorney, Agent, or Firm*—Steins & Associates, P.C.

(57) ABSTRACT

A High-speed Current Mode Analog to Digital Converter is disclosed. The ADC is high-speed, yet is manufacturable at a relatively low cost. The device processes an analog signal through a plurality of successive approximation ADC subcircuits cooperatively arranged to operate in parallel, time-interleaved fashion. The ADC subcircuits operate in current mode rather than voltage mode in order to further accelerate their operations and provide lower cost. Finally, the SDC subcircuits each employ a novel current mode digital-to-analog converter.

14 Claims, 9 Drawing Sheets

CURRENT MODE ANALOG-TO-DIGITAL CONVERTER USING PARALLEL, TIME-INTERLEAVED SUCCESSIVE APPROXIMATION SUBCIRCUITS

This application is filed within one year of, and claims priority to Provisional Application Ser. No. 60/582,588, filed Jun. 24, 2004.

BACKGROUND OF THE INVENTION

1. Field of the Invention

This invention relates generally to Analog to Digital Converters and, more specifically, to a High-speed Current Mode Analog to Digital Converter.

2. Description of Related Art

Generally, the architectures of the analog to digital converters (ADCs) are divided into two types: recursive and non-recursive. A recursive ADC includes some type of feedback circuit, one example of which is a successive-approximation type. A non-recursive ADC does not include a feedback circuit, such that the conversion is feed-forward only; examples of non-recursive ADCs include: flash, pipeline, folding and interpolating. The traditional successive-approximation type of ADC usually includes a digital-to-analog converter (DAC) and compares an input analog signal with an output of the DAC in order to confirm that the output of the DAC converter coincides with an input analog signal.

Figure 1:
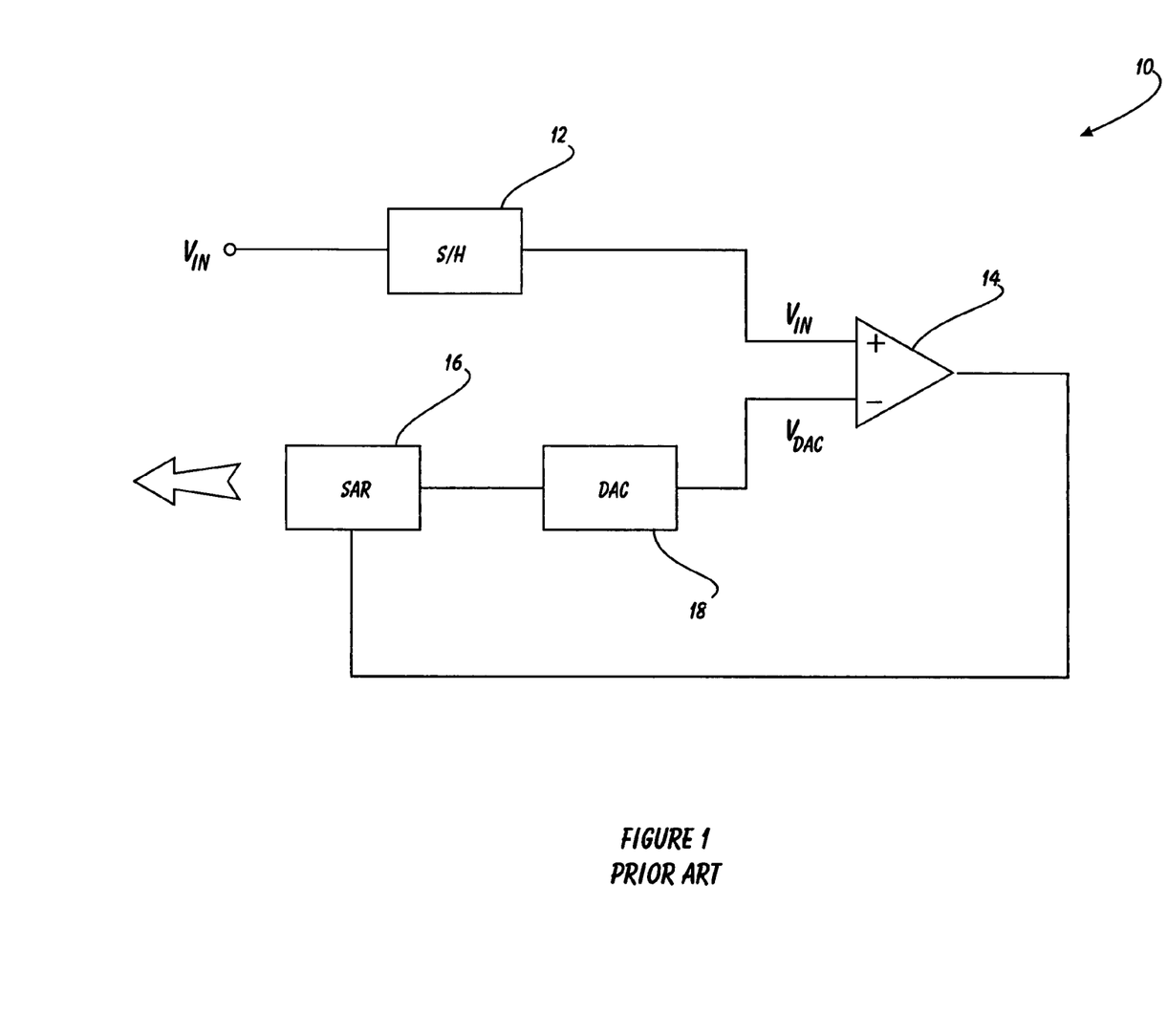
FIG. 1 is a block diagram depicting a conventional analog to digital converter having successive approximation architecture.

A benefit of the successive-approximation type of ADC is that the same circuitry is be used over and over again to determine each number of the digital bit of the analog to digital conversion. Thus, in general, it is more economical because smaller silicon die size can be achieved when a recursive type ADC. In contrast, higher speeds can be more easily achieved when non-recursive type of the ADC is used. Moreover, all of the conventional ADCs require certain stable generated voltages to serve as voltage references during the conversion between analog input signal and digital output. FIG. 1 depicts a conventional ADC.

FIG. 1 is a block diagram depicting a conventional analog to digital converter having successive approximation architecture 10. Analog $V_{IN}$ first enters the sample and hold device 12, where the signal is simply sampled and held in order to provide a buffer for the ADC. The delayed $V_{IN}$ next is applied to comparator 14, where it is compared to $V_{DAC}$, which is the analog voltage (converted to from a digital signal) for a particular clock cycle. The digital comparison result is output by the comparator 14 to the successive approximation register (SAR) 16. The SAR adjusts the digital control signals in order to narrow the compared voltages, and outputs the adjusted digital control signals to a DAC 18. This adjusted digital signal is converted by the DAC 18 into $V_{DAC}$, which is compared to $V_{IN}$ in the comparator 14. If we turn to FIG. 2, we can examine the steps involved in the operation of this conventional ADC.

Figure 2:
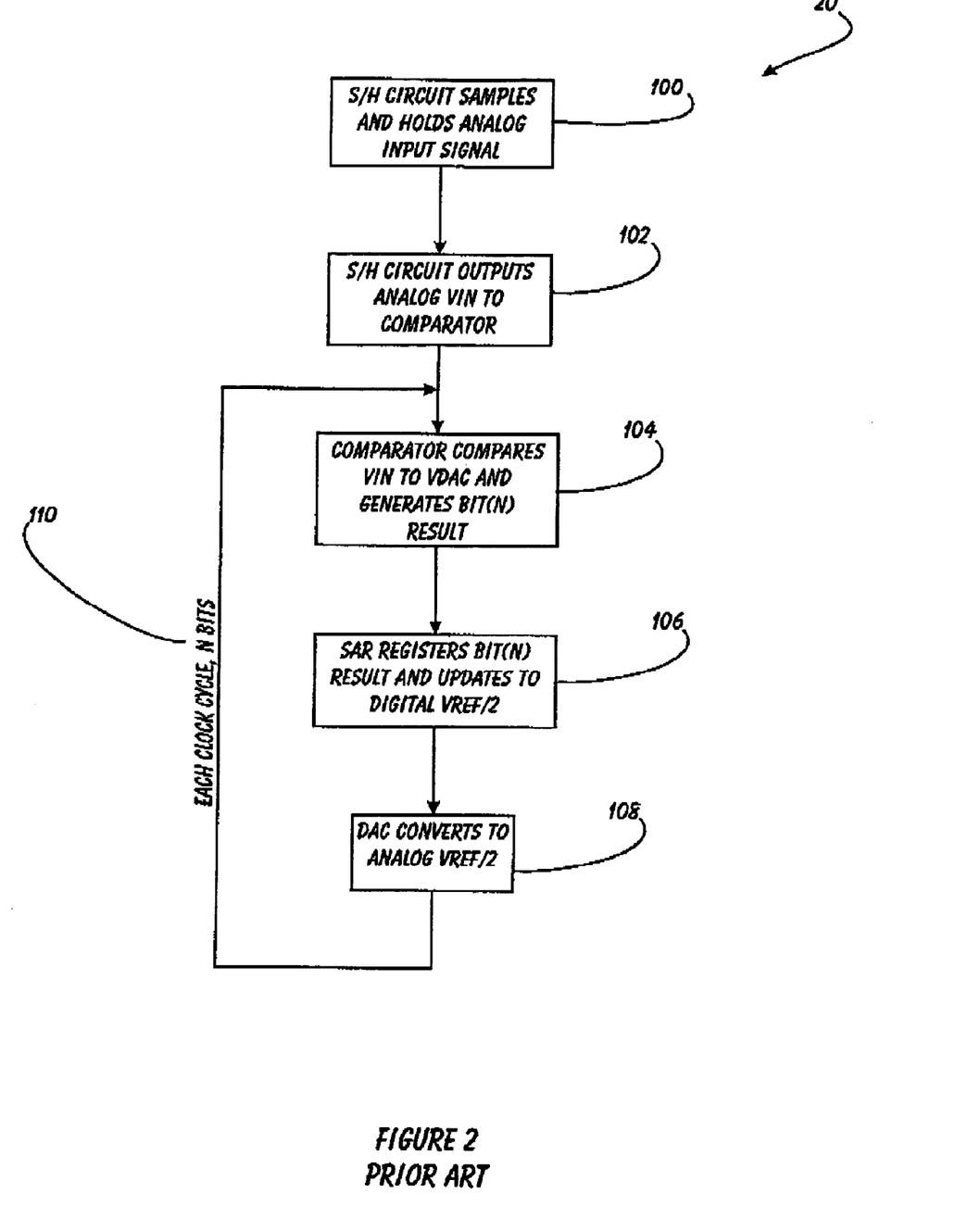
FIG. 2 is a flowchart depicting the method of operation of the ADC of FIG. 1.

FIG. 2 is a flowchart depicting the method of operation 20 of the ADC of FIG. 1. First (during the first clock period), the sample and hold circuit samples and holds the analog input signal ($V_{IN}$) 100. Next, the sample and hold circuit outputs the analog voltage input signal to the comparator 102. The comparator compares $V_{IN}$ to $V_{DAC}$ and generates the digital result for Bit (n) 104. A high value (1) is obtained from the comparator if the value of $V_{IN}-V_{DAC}$ is positive; a low value (0) is obtained from the comparator if the value is negative. The successive approximation register registers the Bit (N) result and updates the comparison voltage to a digital approximation of $V_{REF/2}$, 106. In the first clock period, this would be 100 . . . 000. Digital $V_{REF/2}$ is then converted to analog $V_{REF/2}$ by the DAC 108, which is passed to the comparator for comparison step 104. If the comparator result at the next clock cycle is 1, then the SAR would register 110 . . . 000. After each comparison, the comparator is reset to prepare it for the next comparison.

Steps 104, 106 and 108 are repeated once per clock cycle for N Bits 110, therefore if the conventional successive approximation ADC is N-bit, the elapsed time to convert a signal is N clock periods.

During the second clock period, in the example where the partial digital value of the SAR is 110 . . . 000, $V_{DAC}$ recomputed to be $V_{REF/2}+V_{REF/4}$. If the comparator result is high, the SAR will be updated to 111 . . . 000 (if the comparator result is low, the SAR will be updated to 101 . . . 000). In this way, the two most significant bits (MSB) of the digital value of the SAR have been determined in the first two clock cycles. In the (N+1)th clock period, the digital value of the SAR will be outputted and the method 20 will repeated for the first clock cycle and so on, as discussed above.

"There are several problems with the conventional successive approximation ADC. First, since the number of conversion bits is determined sequentially, each bit of resolution requires a conversion operation. As a result, the conversion time tends to become unacceptably long for high-speed and high-resolution applications. Second, the typical ADC of this type employs a switching capacitor as the DAC; these devices tend to exhibit the traits of charge injection during switching, as well as embodying long settling times. Both of these traits tend to interfere with optimum operation of the ADC."

What is needed, then, is a recursive ADC that combines the cost benefits of a SAR-based architecture with the high speed and high resolution of a non-recursive ADC.

SUMMARY OF THE INVENTION

"In light of the aforementioned problems associated with the prior devices and methods, it is an object of the present invention to provide a High-speed Current Mode Analog to Digital Converter. The ADC should be high-speed, yet be manufacturable at a relatively low cost. The device should process an analog signal through a plurality of successive approximation ADC subcircuits arranged to operate in parallel, time-interleaved fashion. The ADC subcircuits should operate in current mode rather than voltage mode in order to further accelerate their operations and provide lower cost. Finally, the ADC subcircuits should each employ a novel current mode digital-to-analog converter."

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings, of which:

DETAILED DESCRIPTION OF THE PREFERRED EMBODIMENTS

The following description is provided to enable any person skilled in the art to make and use the invention and sets forth the best modes contemplated by the inventor of carrying out his invention. Various modifications, however, will remain readily apparent to those skilled in the art, since the generic principles of the present invention have been defined herein specifically to provide a High-speed Current Mode Analog to Digital Converter.

Figure 3:
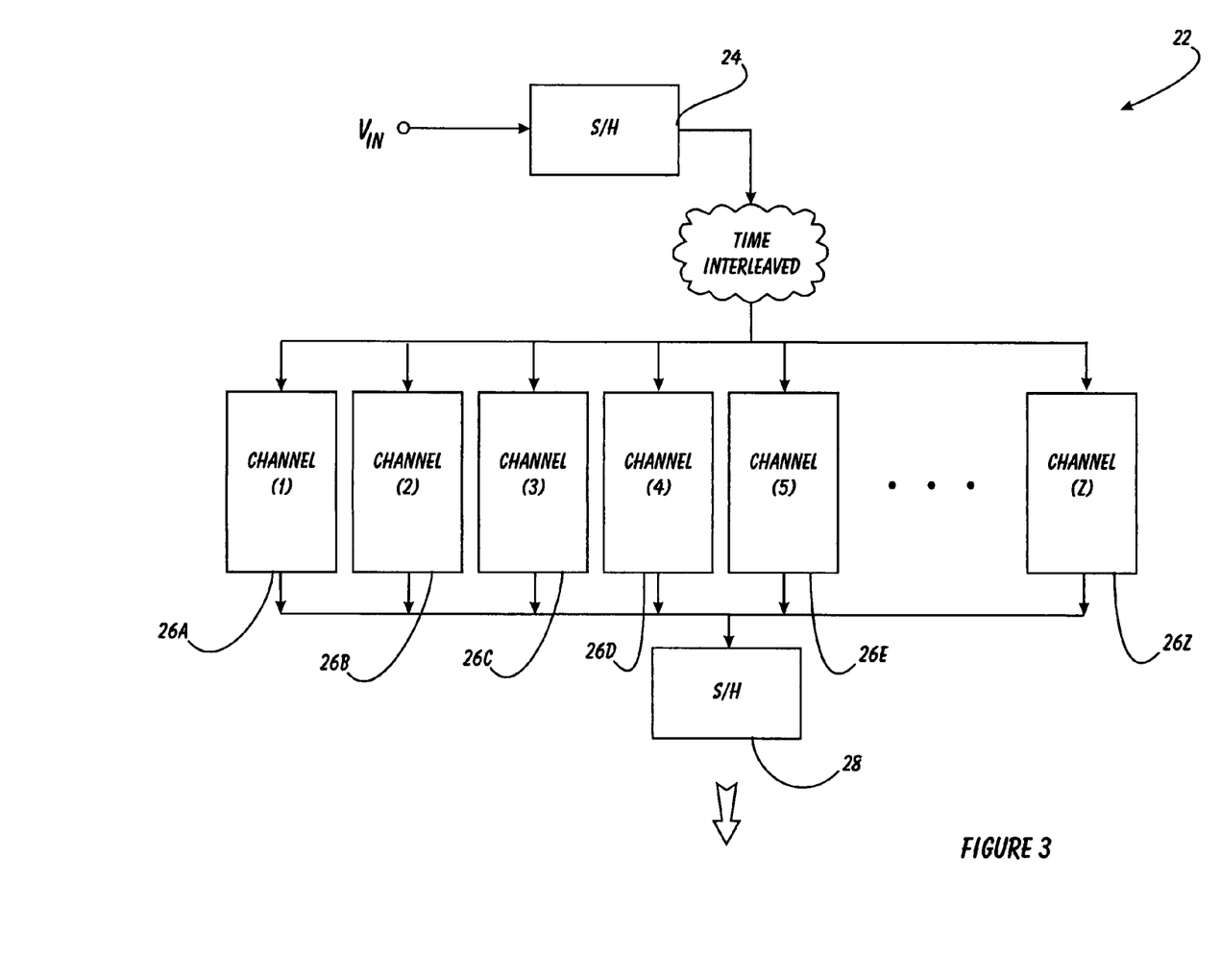
FIG. 3 is a block diagram of a preferred embodiment of the analog to digital converter of the present invention.

The present invention can best be understood by initial consideration of FIG. 3. FIG. 3 is a block diagram of a preferred embodiment of the analog to digital converter of the present invention 22. This unique device and system incorporates time interleaving in order to conduct N-bit analog to digital conversion in parallel, among other unique structural and operational aspects.

The ADC 22 comprises a sample and hold device 24—this, however, is not a conventional sample and hold device, because in addition to sample and holding $V_{IN}$, it also divides the signal into time "slices" and then passes each "slice" to a separate successive approximation-based ADC subcircuit for digital conversion. The sample and hold device 24 is capable of outputting the different channel signals to different SAR subcircuits at different clock cycles without the different channels disturbing one another.

The sample and hold device 24, passes the sampled, held and time-interleaved analog input signal to a plurality of current mode SAR ADC subcircuits 26A–26Z, with "Z" being the number of channels (or time slices) that $V_{IN}$ is analyzed as. The more channels working in parallel, the quicker that the device 22 will be able to convert an analog signal. As will be discussed more fully below, each subcircuit is an independent N-bit ADC operating on its "channel."

The digital outputs of each subcircuit 26 will be passed to a digital encoder 28 which will combine the parallel (by-channel) digital data into a single, clean N-bit digital output. If we now turn to FIG. 4, we can continue to study this unique design.

Figure 4:
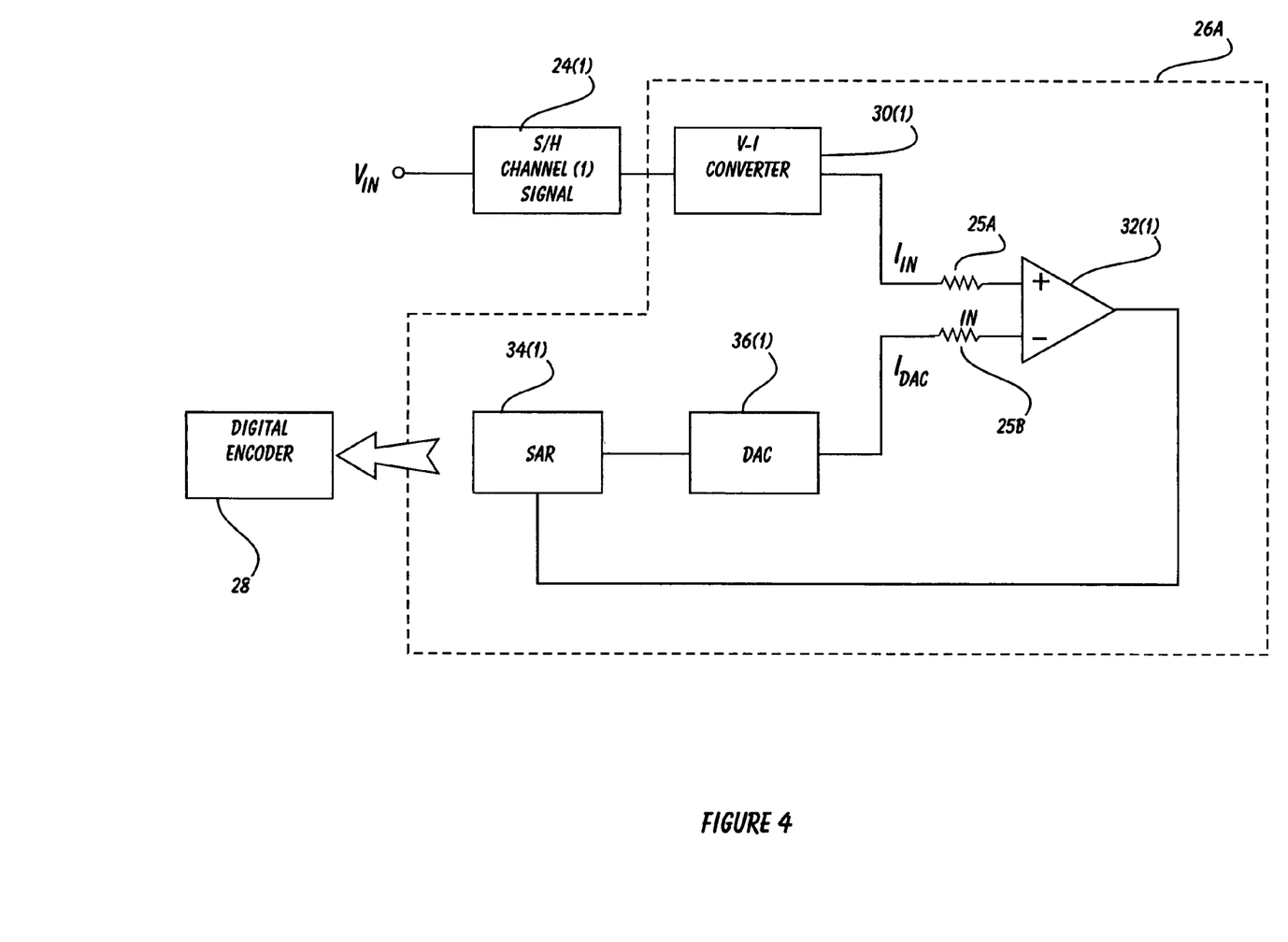
FIG. 4 is a block diagram of an ADC subcircuit of the converter of FIG. 3.

FIG. 4 is a block diagram of an ADC subcircuit 26A of the converter of FIG. 3. It should be understood that subcircuit 26A is merely exemplary—all subcircuits 26 are essentially identical in design and operation.

Item 24(1) is intended to denote the Channel(1) output or portion of the sample/hold device; as discussed above, this is a time slice of the analog input signal $V_{IN}$. The sample/hold channel 24(1) sends its analog voltage signal to a voltage-to-current converter device 30(1). The signal is thus converted to $I_{IN}$; $I_{IN}$ is compared to $I_{DAC}$ by comparator 32(1) to provide the N-bit digital output that is registered at the SAR. $I_{IN}$ and $I_{DAC}$ are actually compared as voltages after passing through resistors 25A and 25B.

"Just as with a conventional ADC, a SAR obtains and registers each bit of the N-bit digital conversion of Channel (1)'s analog input. The difference here is that the SAR 34(1) is a current mode successive approximation register, rather than a conventional voltage mode device. Similarly, a current mode DAC 36(1) is employed in this device 26A. rather than a conventional voltage mode DAC. Current mode Successive Approximation ADCs (SA-ADCs) are used because of the inherent stability in reference current source as compared to reference voltage sources. Furthermore, current mode DACs tend to operate more quickly than voltage mode DACs."

Figure 5:
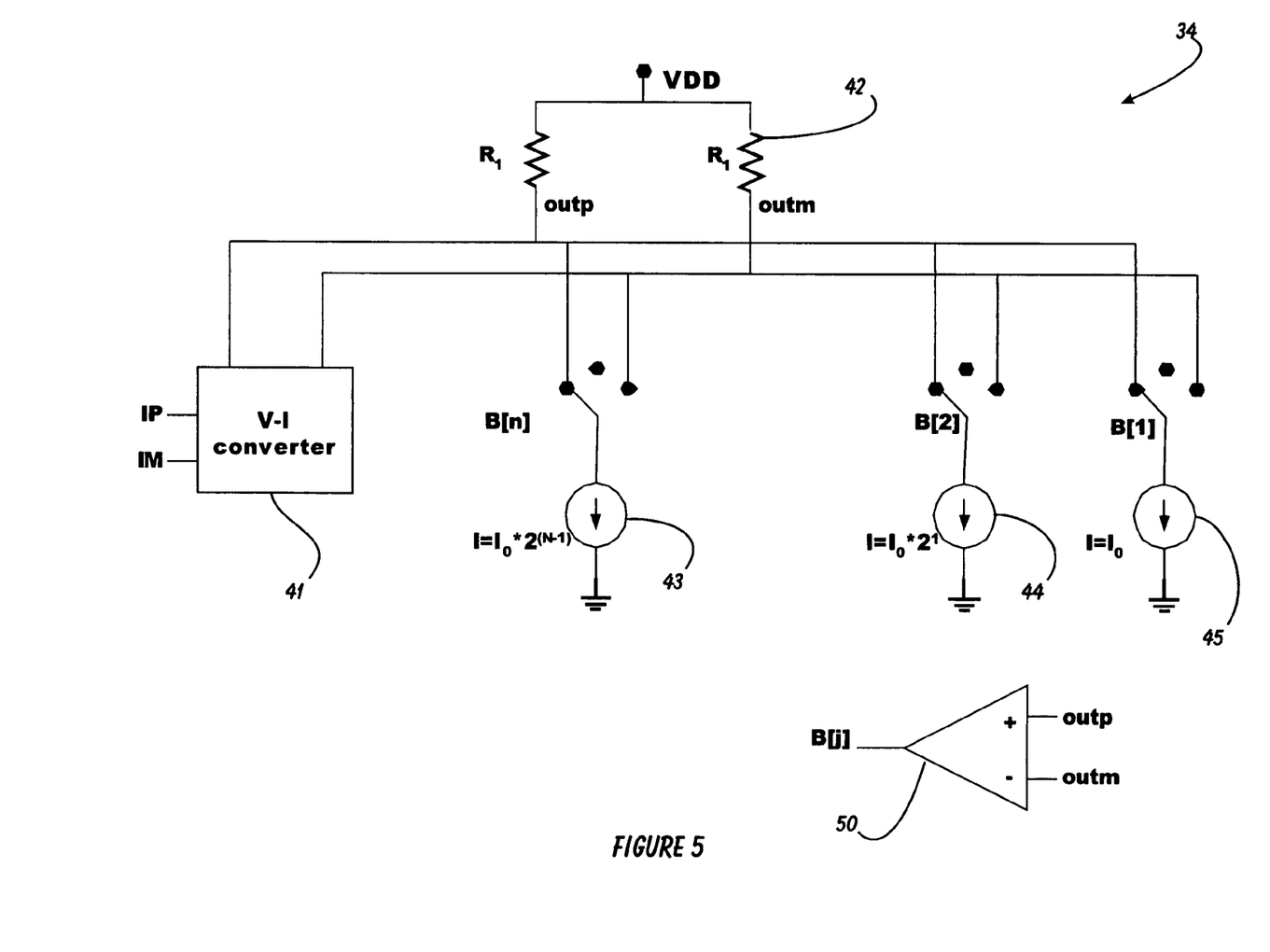
FIG. 5 is a circuit diagram of a current-mode SAR of the ADC subcircuit of the converter of FIGS. 3 and 4.

Upon completion of the N-bit digital-to-analog conversion, in the N+1 clock cycle, the SAR digital signal output is sent to the digital encoder 28 for combination with the other channels of digital signal. FIG. 5 depicts an example of the workable circuit for use in this system.

FIG. 5 is a circuit diagram of a current-mode SAR 34 of the ADC subcircuit of the converter of FIGS. 3 and 4 (i.e. this is one channel's SAR device 34, such as 34(1) shown above in FIG. 4). Each SAR (also known as a "quantizer") comprises a voltage-to-current converter 41 to convert the sampled and held analog voltage (e.g. Channel(1) of $V_{IN}$) to an analog current signal (e.g. $I_{IN}$ (1)).

"The device 34 has N current sources (e.g. 43–45), each having a different current value (1), and a switch B associated with each of them. Furthermore, each SAR (SA-ADC) 34 has a pair of differential resistors 42 to convert the current signals to voltage (after switching) so that the comparator 50 will actually operate on a voltage."

"The current value through the N current sources (e.g. 43–45) have a binary relation to one another. When the current of the smallest current source 45 is set to $I_0$ the second smallest current source 44 is set at twice that amount, and so on down the line in cascading fashion. The largest current source 43. therefore, is set to $2^{(N-1)} \times I_0$. As with a conventional voltage-mode SAR, the digital conversion in this current mode SAR (SA-ADC) 34 requires N clock cycles. At the first clock cycle, all switches B[1] to B[N] are initially reset to the middle position (i.e. neither high nor low). In this position, the output of the current sources (e.g. 43–45) is equally distributed across the resistor pair 42, and therefore no voltage is generated."

Figure 7:
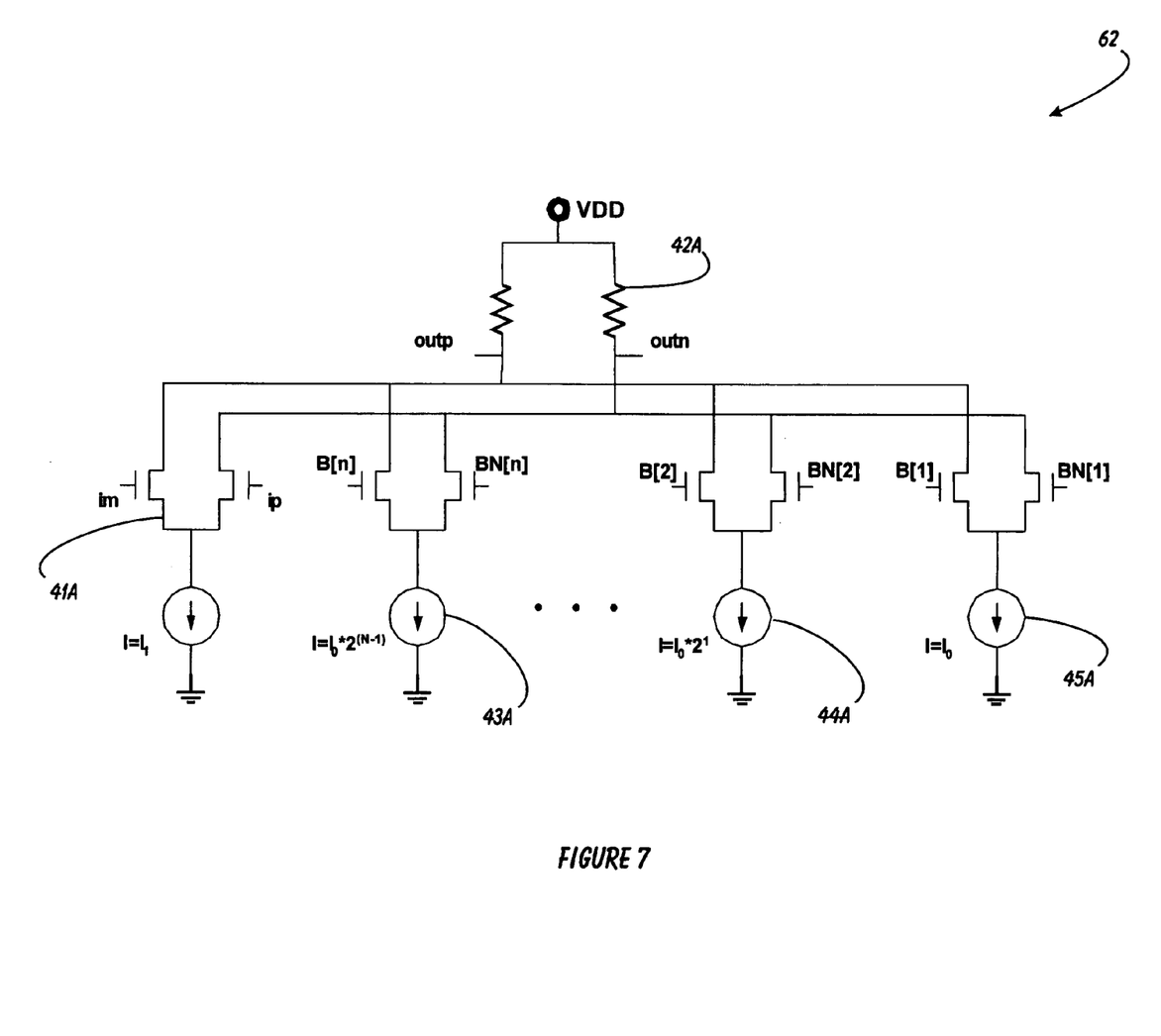
FIG. 7 is a circuit diagram of a DAC subcircuit of the converter of FIGS. 3–5.

"As each ADC subcircuit converts its channel, the digital approximation for that channel is sent to the digital encoder, where mismatches (DC offset and Gain mismatches) are corrected and an N-bit output combining all channels is generated 214. Turning to FIG. 7, we can examine the unique voltage to current conversion aspects of the DAC of the present invention."

In the second cycle, the comparator 50 result will progressively switch each switch B[N] until the Nth clock cycle is finished. After N clock cycles, the positions of switches B[N] to B[1] is the digital result registered by the current mode SAR 34 that is passed on to the digital encoder (see FIG. 4). The method executed by the device of the present invention is discussed in FIG. 6.

Figure 6:
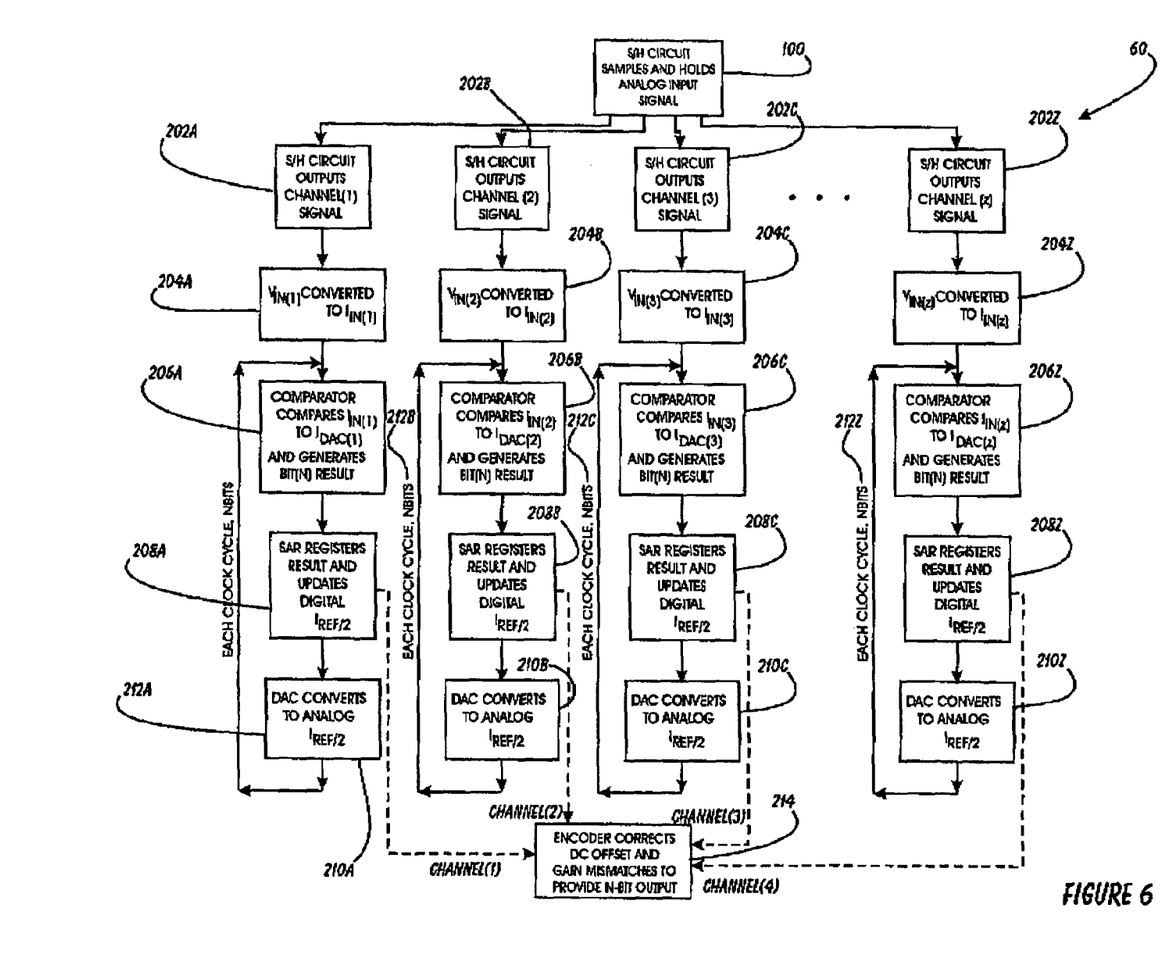
FIG. 6 is a flowchart depicting the method of operation of the ADC of FIGS. 3–5.

FIG. 6 is a flowchart depicting the method of operation 60 of the ADC of FIGS. 3–5. First, the sample and hold circuit samples and holds analog input (voltage) signal 100—it is after this that the method 60 departs from the prior art. Next, the sample/hold circuit divides the analog signal into discrete channels phased by time; each channel being output 202 as a signal for handling by separate ADC subciruits in parallel.

Each channel of $V_{IN}$ is converted to current signal $I_{IN}$ (channel #) 204. Next, $I_{IN}$ (channel#) is compared to $I_{DAC}$ (channel#) 206 to generate bit(N) result. The SAR(channel #) registers this result and updates the digital current to the comparator to $I_{REF}/2$ 208. The DAC then converts $I_{REF}/2$ to an analog current signal 210. This process is conducted for N clock cycles 212, in order to create an N-bit digital signal for analog input signal $V_{IN}$ (channel 3).

As each ADC subcircuit converts its channel, the digital approximation for that channel is sent to the digital encoder, where mismatches are corrected and an N-bit output combining all channels is generated 214. Turning to FIG. 7, we can examine the unique voltage to current conversion aspects of the DAC of the present invention.

FIG. 7 is a circuit diagram of a DAC subcircuit 62 of the converter of FIGS. 3–5. As shown here, the voltage to current converter is created through the use of differential transistor pair 41A. Furthermore, switches B[N] to B[1] are also created by implementing differential transistor pairs, where B[N] and BN[N], for example, are set at opposite states. As with the ADC subcircuit discussed above, then, the first clock cycle after reset will be a comparison of the input current. The current sources I will also be set in the same fashion as the ADC subcircuit discussed above.

Figure 8:
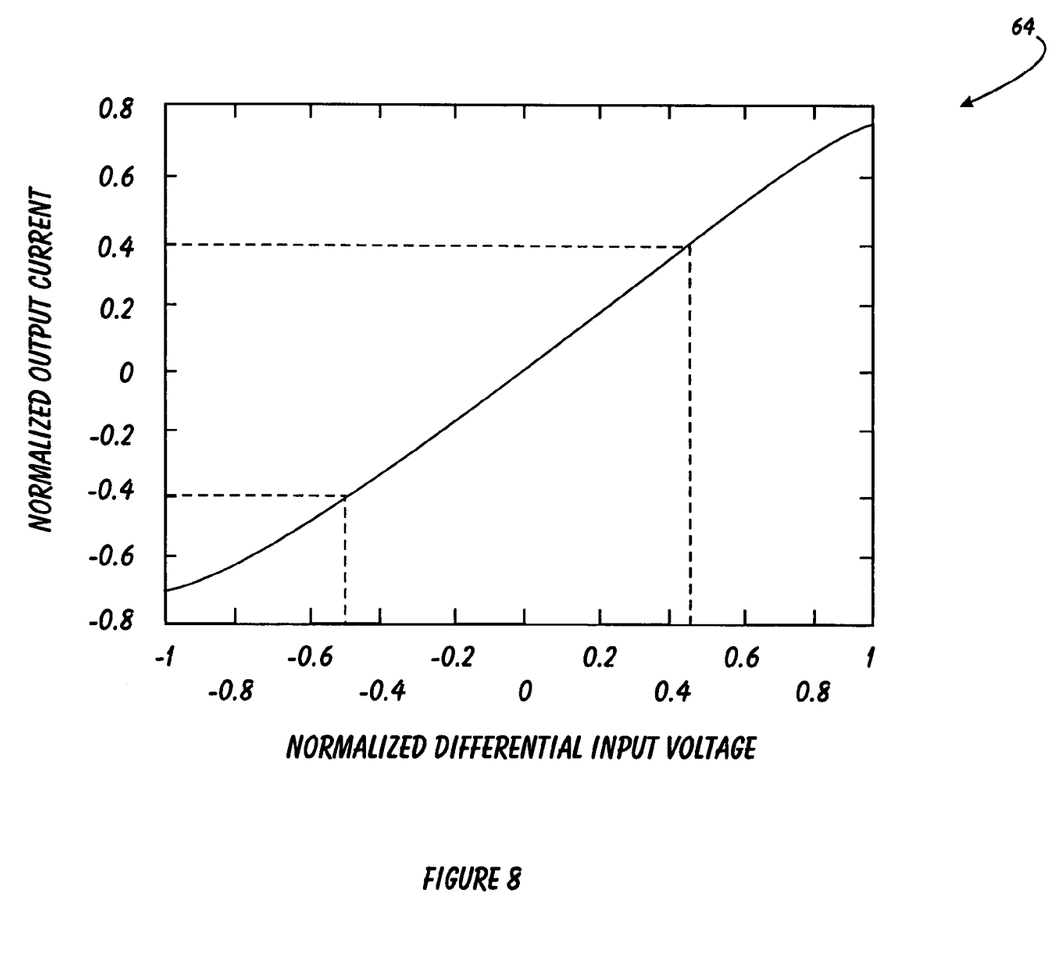
FIG. 8 is a performance curve of a voltage to current converter used in the ADC of FIGS. 3–5.

FIG. 8 is a performance curve 64 of a voltage to current converter used in the ADC of FIGS. 3–5. As shown, the linearity decreases as the input voltage increases. Since linearity is critical in any ADC, the analog input voltage cannot be allowed to exceed a certain amount. If the maximum converting current within the linearity requirement is "I," then the total amount of current through all switches shall satisfy the relationship $I=(2^N \times I_0)$.

For open-loop voltage-to-current conversion, it has been found that in excess of 8-bit conversion can be accomplished, however, it should be understood that as the bit resolution increases, the voltage and current range decreases, thereby making it more challenging for the comparators to resolve the comparison result. In current mode, it is stable enough to run open loop, which has speed benefits. Furthermore, current mode comparators are known to operate faster than voltage mode comparators, thereby further accelerating the analog to digital conversion process.

Figure 9:
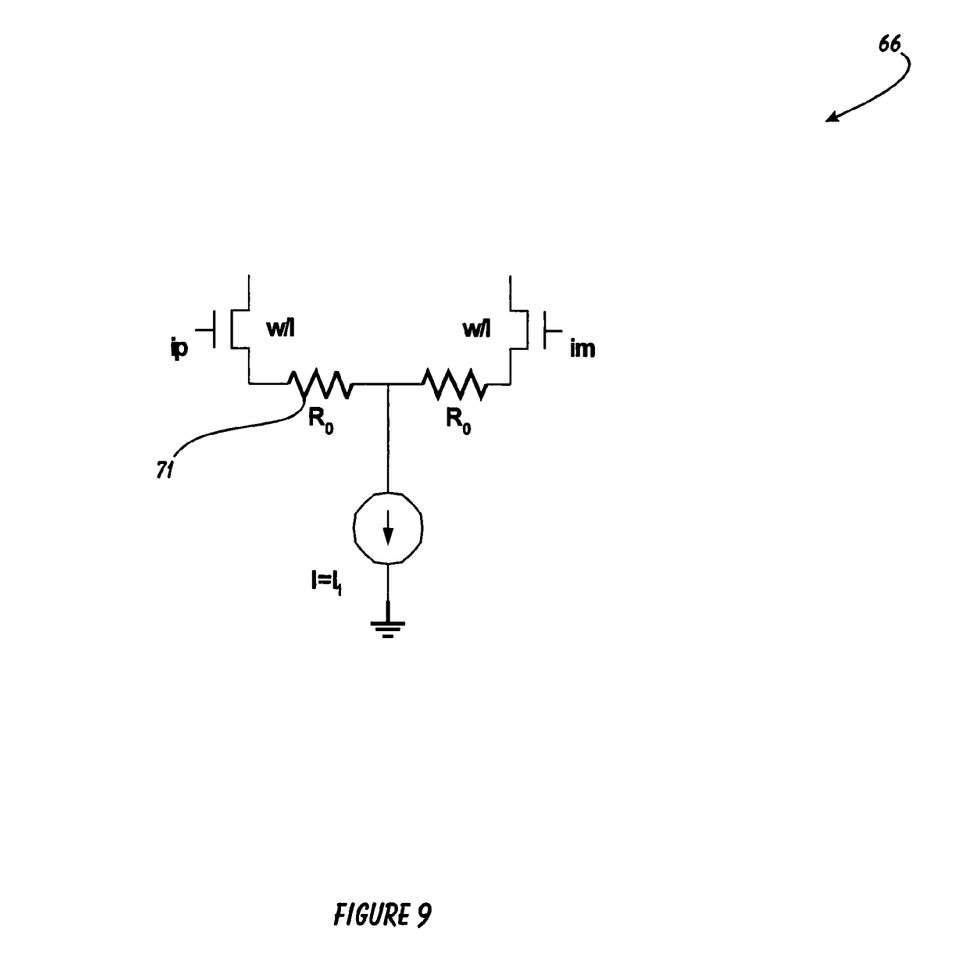
FIG. 9 is a circuit diagram of the voltage to current converter of FIG. 9.

FIG. 9 is a circuit diagram of the voltage to current converter of FIG. 5. The circuit depicted in FIG. 9 improves the linearity of the differential transistor pair's voltage-to-current curve, and can be used as a replacement for traditional differential transistor pairs.

Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. An analog-to-digital converter, comprising:
   sample and hold means for sampling and holding an analog input signal;
   first conversion means for converting said sampled and held analog input signal into an analog current input signal, said analog current input signal defining an analog current input time period;
   multiplexing means for dividing said analog current input signal into sequential analog current subsignals, each said analog current subsignal defined by an analog subsignal time period;
   comparator means for comparing each said sequential analog current subsignal to a processed analog current subsignal and for generating an output subsignal;
   control means for generating a digital subsignal based on each said output subsignal;
   second conversion means for converting each said digital subsignal into said processed analog current subsignal; and
   encoding means for generating a digital output signal from said digital subsignals.

2. The converter of claim 1, wherein said first conversion means, multiplexing means, comparator means, control means and second conversion means respectfully comprise at least two current mode analog-to-digital converter subcircuits, each said subcircuit defining a channel.

3. The converter of claim 2, wherein said current mode analog-to-digital converter subcircuits are operatively connected to said sample and hold means and said encoding means in parallel arrangement.

4. The converter of claim 3, wherein said control means comprising a current mode successive approximation register.

5. The converter of claim 4, wherein said second conversion means comprises a current mode digital-to-analog converter.

6. The converter of claim 1, wherein said encoding means further cancels DC offset mismatch and gain mismatch in said digital subsignals.

7. An analog to digital converter subcircuit, comprising:
   a voltage to current converter said converter employing feedforward control versus feedback control;
   a comparator operatively connected to said voltage to current converter whereby an analog current mode signal generated by said voltage-to-current converter is compared by said comparator to a processed analog current mode signal to generate a digital comparator output;
   a successive approximation register operatively connected to said comparator to receive and store said digital comparator output; and
   a digital-to-analog converter operatively connected to said successive approximation register and said comparator, whereby said digital comparator output is converted into said processed analog current mode signal.

8. A method for converting an analog voltage signal into a digital output signal, the method comprising the steps of:
   sampling and holding an analog voltage input signal;
   dividing said analog voltage input signal into sequential analog voltage subsignals;
   first converting each said sequential analog voltage subsignals into an analog current input subsignals;
   comparing each said analog current subsignal to a processed analog current subsignal;
   first generating an output subsignal based on each said comparing;
   second generating a digital subsignal based on each said output subsignal;
   second converting each said digital subsignal into said processed analog current subsignal; and
   third generating a digital output signal from said digital subsignals.

9. The method of claim 8, wherein said second generating is conducted by a plurality of differential pairs defining N clock cycles and N+1 differential pairs, and further said first output subsignal generating for each said output subsignal is driven to a most significant bit of an input of said differential pairs.

10. The method of claim 8, wherein said first converting, dividing, comparing, first generating, second generating and second converting steps are executed by at least two current mode analog-to-digital converter subcircuits, each said subcircuit defining a channel.

11. The method of claim 10, wherein each said channel first converting, dividing, comparing, first generating, second generating and second converting steps are executed in parallel.

12. The method of claim 11, wherein said second converting is conducted by a current mode digital-to-analog converter.

13. The method of claim 12, wherein said second generating is executed by a current mode successive approximation register.

14. The method of claim 13, wherein said third generating further comprises cancelling DC offset mismatch and gain mismatch in said digital subsignals.

* * * * *